US009142705B2

(12) United States Patent  (10) Patent No.: US 9,142,705 B2
Stolt et al.  (45) Date of Patent: Sep. 22, 2015

(54) METHOD AND APPARATUS FOR IN-LINE PROCESS CONTROL OF THE CIGS PROCESS

(75) Inventors: Lars Stolt, Uppsala (SE); John Kessler, Nantes (FR)

(73) Assignee: SOLIBRO RESEARCH AB, Uppsala (SE)

( * ) Notice: Subject to any disclaimer, the term of this patent is extended or adjusted under 35 U.S.C. 154(b) by 2130 days.

(21) Appl. No.: 10/591,391

(22) PCT Filed: Mar. 4, 2005

(86) PCT No.: PCT/SE2005/000333
§ 371 (c)(1),
(2), (4) Date: Jun. 30, 2008

(87) PCT Pub. No.: WO2005/086238
PCT Pub. Date: Sep. 15, 2005

(65) Prior Publication Data
US 2008/0254202 A1   Oct. 16, 2008

(30) Foreign Application Priority Data
Mar. 5, 2004   (SE) ........................ 0400582

(51) Int. Cl.
*C23C 16/00* (2006.01)
*H01L 31/18* (2006.01)
(Continued)

(52) U.S. Cl.
CPC ............ *H01L 31/18* (2013.01); *C23C 14/0623* (2013.01); *C23C 14/548* (2013.01); *C23C 14/56* (2013.01); *H01L 31/0322* (2013.01); *Y02E 10/541* (2013.01)

(58) Field of Classification Search
CPC ....................................................... H01L 31/18
USPC .......................................................... 118/726
See application file for complete search history.

(56) References Cited

U.S. PATENT DOCUMENTS 4,121,238 A * 10/1978 Bachmann et al. ........... 257/449
4,335,266 A * 6/1982 Mickelsen et al. ............ 136/260
(Continued)

FOREIGN PATENT DOCUMENTS

EP   0 683 532 A2   11/1995

OTHER PUBLICATIONS

CN Office Action dated Jun. 4, 2010 in corresponding 200910150553.4.
(Continued)

*Primary Examiner* — Keath Chen
(74) *Attorney, Agent, or Firm* — Young & Thompson

(57) ABSTRACT

An in-line production apparatus and a method for composition control of copper indium gallium diselenide (CIGS) solar cells fabricated by a co-evaporation deposition process. The deposition conditions are so that a deposited Cu-excessive overall composition is transformed into to a Cu-deficient overall composition, the final CIGS film. Substrates with a molybdenum layer move through the process chamber with constant speed. The transition from copper rich to copper deficient composition on a substrate is detected by using sensors which detect a physical parameter related to the transition. A preferred embodiment sensors are provided that detect the composition of elements in the deposited layer. A controller connected to the sensors adjusts the fluxes from the evaporant sources in order provide a CIGS layer with uniform composition and thickness over the width of the substrate.

16 Claims, 5 Drawing Sheets

(51) Int. Cl.
*C23C 14/06* (2006.01)
*C23C 14/54* (2006.01)
*C23C 14/56* (2006.01)
*H01L 31/032* (2006.01)

(56) References Cited

U.S. PATENT DOCUMENTS

| | | | |
|---|---|---|---|
| 5,141,564 A * | 8/1992 | Chen et al. | 136/258 |
| 5,439,575 A | 8/1995 | Thornton et al. | |
| 5,441,897 A | 8/1995 | Noufi et al. | |
| 5,633,033 A * | 5/1997 | Nishitani et al. | 427/8 |
| 5,880,823 A * | 3/1999 | Lu | 356/72 |
| 2001/0022992 A1* | 9/2001 | Regittnig | 427/250 |
| 2002/0106873 A1* | 8/2002 | Beck et al. | 438/482 |
| 2002/0139303 A1* | 10/2002 | Yamazaki et al. | 118/719 |
| 2003/0082834 A1* | 5/2003 | Delahoy | 438/7 |
| 2005/0072461 A1* | 4/2005 | Kuchinski et al. | 136/256 |

OTHER PUBLICATIONS

Stolt et al., "CuInSe2 for thin Film Solar Cells", Institute of Microwave Technology, p. 850-854.

* cited by examiner

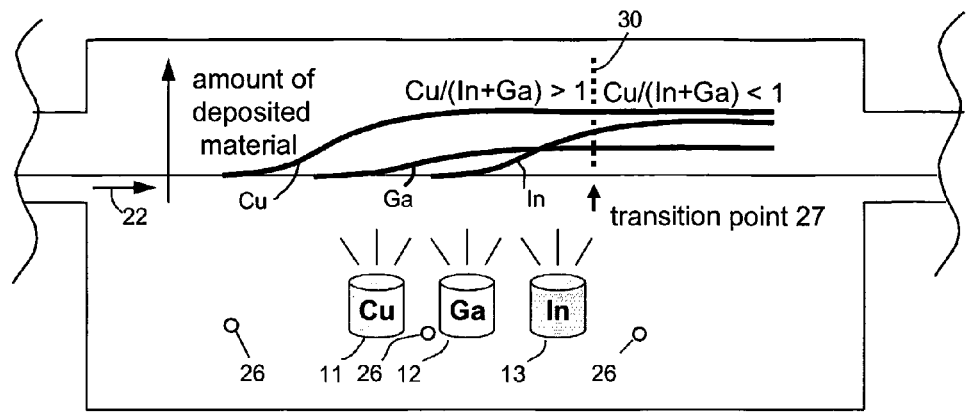
FIG. 4
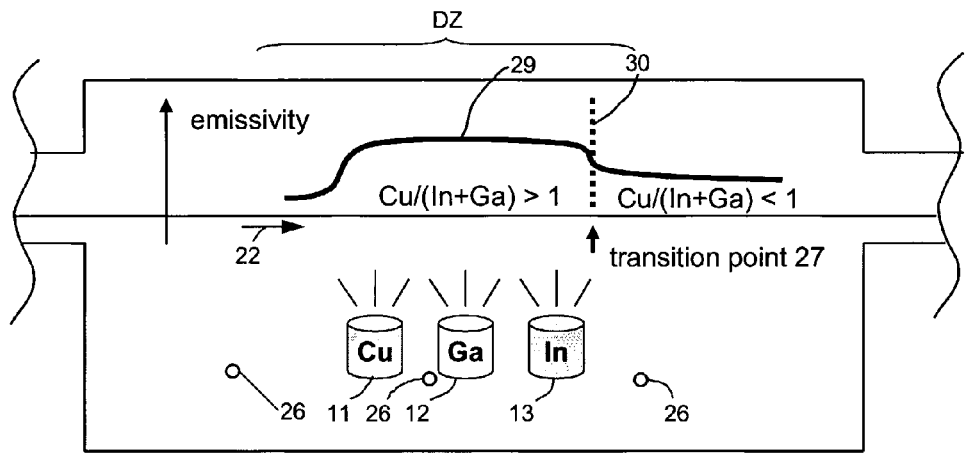
FIG. 5
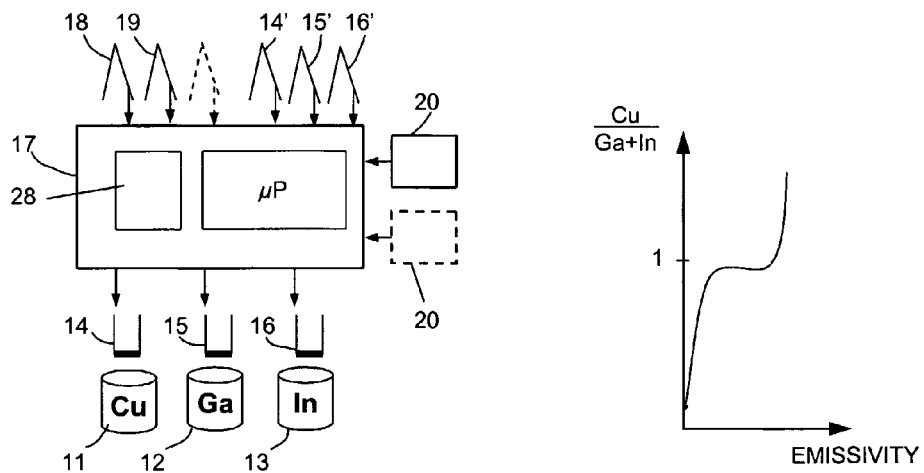
FIG. 6
FIG. 7

METHOD AND APPARATUS FOR IN-LINE PROCESS CONTROL OF THE CIGS PROCESS

TECHNICAL FIELD OF THE INVENTION

The invention relates to a method and apparatus for fabrication of copper indium gallium diselenide (CIGS) solar cells by a co-evaporation deposition process in a process chamber. The invention also relates to a method and device for control of the thickness and composition of the deposited CIGS layer.

TECHNICAL BACKGROUND

Solar cells provide a means to produce electric power with minimal environmental impact because it is a renewable technology. In order to become a commercial success the solar cells need to be efficient, to have low cost, to be durable, and not add other environmental problems.

Today's dominant solar cell technology is based on crystalline silicon. It fulfils many of the requirements mentioned above but can not be produced at such low cost that electricity generation in large scale is cost effective. It also requires relatively large amount of energy in the production, which is an environmental disadvantage.

Solar cells based on thin film technologies have been developed. They offer a potential of substantial cost reductions but have, in general, lower conversion efficiencies and less good durability. A very promising thin film solar cell technology is based on the semiconductor $Cu(In,Ga)Se_2$ (CIGS) which has demonstrated high efficiencies (16.6% in small prototype modules) and durability in operation.

DESCRIPTION OF RELATED ART

In FIG. 1 a CIGS solar cell is shown to comprise a CIGS layer 1 on a substrate material 2 such as sheet glass or metal foil, which has been coated with a layer 3 of molybdenum. This layer serves as a back contact of the solar cell. The CIGS growth is followed by the formation of a pn-junction by deposition of a buffer layer 4, typically 50 nm of CdS, a high resistivity thin layer 5 of ZnO (sometimes omitted) and a front contact 6 of a transparent conductive oxide 6. One critical factor for obtaining solar cells with high light to electricity conversion efficiency is the quality of the CIGS material.

U.S. Pat. No. 6,310,281 describes high vacuum co-deposition methods using three or five boats as effusion sources for the elements to be deposited. In the three vapour source method a strip of Mo-coated substrate material travels in a chamber through the vapor deposition zone. Each point on that material first passes directly over the copper source, thereafter over the gallium source, thereafter over the indium source, and throughout, over the selenium sources.

The respective vapor effusion rates of copper, gallium and indium from the crucibles/boats are controlled in such a fashion that the entrance end of the vapour deposition zone is copper-rich, the middle region of this zone is gallium-rich, and the exit end of the zone is indium-rich. By establishing appropriate effusion rates for copper, gallium and indium the composition of the CIGS film varies along the deposition zone in accordance with the following: (a), within the entrance end of the deposition zone the ratio (Cu)/(Ga+In) is generally about 3.4, and the ratio (Ga)/(Ga+In) is generally about 0.46; (b), within the middle region of the deposition zone the ratio (Cu)/(Ga+In) is generally about 1.9, and the ratio (Ga)/(Ga+In) is generally about 0.43; and (c), within the exit end of the deposition zone the ratio (Cu)/(Ga+In) is generally between 0.8 and 0.92, most preferably, about 0.88, and the ratio (Ga)/(Ga+In) is between generally between 0.25 and 0.3, most preferably 0.275.

The CIGS layer created has an internal make-up or composition of approximately 23.5 atomic percent copper, 19.5 atomic percent indium, 7 atomic percent gallium, and 50 atomic percent selenium.

In accordance with the patent deposition of the various elements is controlled by controlling the vapour effusion rates from nozzles in crucibles and by controlling the temperatures of the molten metals within reservoirs in the crucibles.

The patent does not disclose any means for detecting a transformation of a copper rich CIGS composition into a copper deficient CIGS composition. Neither does the patent describe any means for control of the deposition of the CIGS layer.

The patent also discloses a five stage process according to which each point of the surface of the film in the CIGS chamber encounters, in sequence, a gallium/indium-rich region, a copper-rich region, and finally another indium/gallium-rich region.

U.S. Pat. No. 5,633,033 relates to a method of manufacturing a chalcopyrite film for a solar cell and to a method of monitoring an electrical or optical property of the film in order to determine an end point of the last method step where the electrical or optical property of the film demonstrates a specific change. Once the end point is detected the process is stopped.

SUMMARY OF THE INVENTION

One object of the present invention is to provide a control method for accurate control of the co-deposited CIGS layer in an in-line system for fabrication of CIGS solar cells, wherein substrates provided with a molybdenum back contact layer continuously move through a CIGS process chamber.

Another object of the invention is to provide a uniform deposition of the CIGS layer over the width of the substrates as seen in the transport direction of the substrates through the process chamber. This is achieved by using at least two rows of evaporation sources, as seen in the transport direction of the substrates through the process chamber, the evaporation sources in one row being controlled more or less independently of the sources of the other rows in order to provide a uniform thickness and a uniform composition of the CIGS layer.

Still another object of the invention is to provide control methods that use sensors that either detect a transition point in the deposited CIGS layer or detect the thickness and composition of the deposited CIGS layer.

One control method in accordance with the invention is based on the fact that several physical and chemical properties of the CIGS material changes abruptly when the CIGS layer is transformed from a Cu-excessive to Cu-deficient composition. In particular the travelling CIGS layer transforms from a two-phase material comprising $Cu(In,Ga)Se_2$ and $Cu_xSe$ into a single phase material comprising $Cu(InGa)Se_2$. The control method is independent of the method used for the manufacture of the CIGS layer. In accordance with the invention the position in the CIGS process chamber at which the transformation takes place, this position being referred to as a reference transition point, is detected. Further, by detecting a shift of the position at which the transformation occurs, this position being referred to as the actual transition point, from the reference transition position and take a corrective action to bring the actual transition point back to the reference transition point it is possible to accurately control the composition of the CIGS layer.

Detection of the transition point is made with at least one sensor adapted to measure a physical parameter representative of the transition. The control action is taken by a controller that receives and processes the sensor signal and provides a corrective signal that adjusts the evaporant fluxes so that the transition point is brought back to its reference position in the process chamber. In the above referenced U.S. Pat. No. 5,633,033 the control process is stopped when the transition is detected, while according to the present invention the transition detection process continues all the time and generates control parameters which are used to generate a corrective signal which is used to bring back the transition point to its reference position.

Two sensors forming a sensor pair may be used in order to detect the transition point. The sensors of a pair are arranged at each side of the transition point. There may be two or more sensor pairs arranged over the width of the process chamber in order to detect a respective transition point. A set of evaporation sources is associated with each sensor pair. Each sensor pair and its associated set of evaporation sources are connected to a respective controller. A controller adjusts any of its associated evaporation sources in order to keep its respective transition point generally still. Control takes place by adjusting the power to the relevant evaporation source heater. The use of several sensor pairs arranged over the width of the process chamber enhances the precision with which the CIGS layer is deposited as seen in a direction over the width of the process chamber.

By providing an x-ray fluorescence composition measuring apparatus, below referred to as an XRF device, downstream the reference transition point it is possible to accurately control the thickness and composition of the CIGS material, thus proving a high output rate of substrates that have accurately controlled composition and thickness.

The method provides a fast feed-back loop in order to achieve good control dynamics.

DETAILED DESCRIPTION OF EMBODIMENTS

Figure 1:
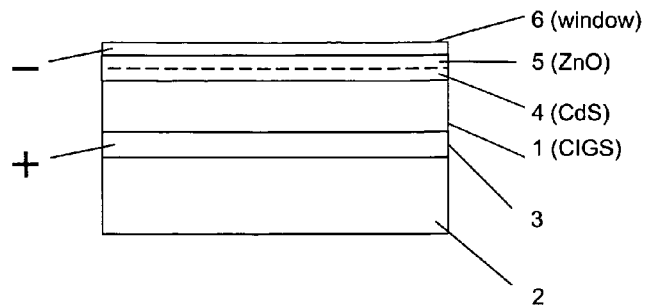
FIG. 1. is a cross sectional view of a CIGS solar cell

Refer to FIG. 1. The commonly used way of fabricating CIGS solar cells is includes the growth of a CIGS layer 1 on a substrate material 2, such as sheet glass or metal foil, which has been coated with a layer of Mo 3. The Mo layer serves as back contact of the solar cell. The CIGS growth is followed by the formation of a pn-junction by deposition of a buffer layer 4, typically 50 nm of CdS, an optional high resistivity thin layer of ZnO 5 and a front contact of a transparent conductive oxide 6. One critical factor for obtaining solar cells with high light to electricity conversion efficiency is the quality of the CIGS material.

Figure 2:
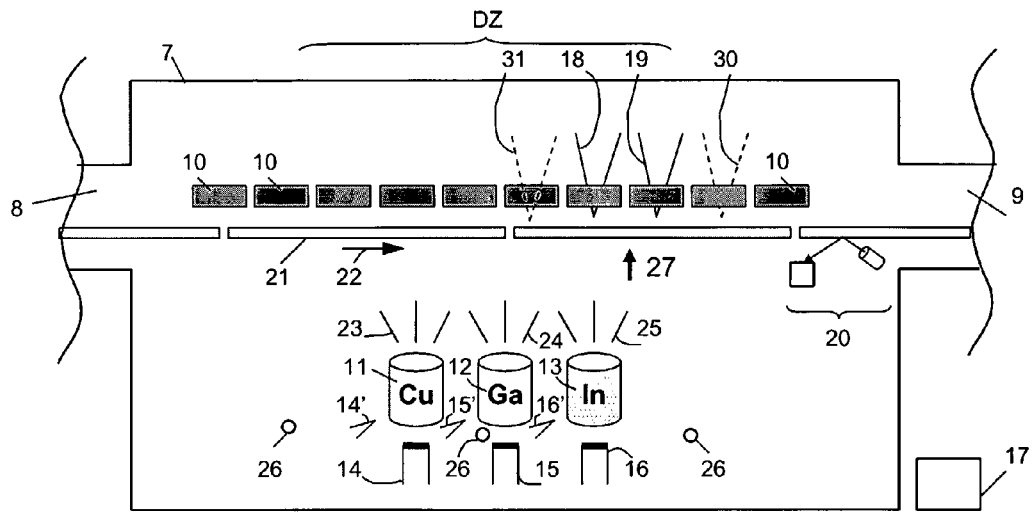
FIG. 2. is a cross sectional view of a CIGS process chamber provided with the control in accordance with the invention FIG. 3. is a view similar to FIG. 2 illustrating evaporation rate profiles for the deposited elements FIG. 4. is a view similar to FIG. 2 illustrating CIGS film composition vs time/position in the process chamber FIG. 5. is a view similar to FIG. 2 illustrating CIGS film emissivity vs time/position FIG. 6. is a view of the controller, FIG. 7. is a graph illustrating the sharp transition point in a graph of Cu/Ga+In vs time, FIG. 8. is a schematic bottom view of the CIGS process chamber and illustrates a second embodiment of the deposition and control systems, FIG. 9. is a schematic bottom view of the CIGS process chamber and illustrates the use of several sensors at each substrate heater, FIG. 10. is a schematic bottom view of the CIGS process chamber and illustrates a second embodiment of the control systems, FIG. 11. is a schematic bottom view of a process chamber, wherein a preferred embodiment of the invention is disclosed, FIG. 12. is a side view of the process chamber shown in FIG. 11, FIG. 13. is a diagram illustrating the elemental flux along a row region in the substrate plane in the embodiment of FIG. 12, FIG. 14. is a diagram illustrating the output signal from the detection device shown in FIG. 12, FIG. 15. is a schematic bottom view of the process chamber, wherein a further embodiment of the invention is disclosed, and FIG. 16. is a cross section view of the process chamber.

Although the invention will be described in connection with a horizontal deposition system, it should be understood the present invention can be used with a vertical deposition system. In FIG. 2 the deposition system comprises a process chamber 7 for the inventive fabrication of a CIGS layer. The process chamber is shown to comprise an inlet 8, an outlet 9, a plurality of substrate heaters 10, a copper evaporation source 11, a gallium evaporation source 12, an indium evaporation source 13, and individual evaporation source heaters 14, 15, 16. Within the process chamber 7 and specifically within a deposition zone DZ the co-evaporation process for establishing the CIGS layer is performed. Thermocouples 14', 15' and 16' are arranged to measure the temperature of the individual evaporation sources. Non-shown temperature controllers are adapted to maintain the temperature of the respective evaporation sources constant. An inventive control system comprises a controller 17 connected to sensors 18, 19 and to the evaporation sources heaters 14-16. An XRF device 20 measures the composition and the thickness of the deposited CIGS layer. Selenium sources 26 are located to give excess selenium at all growth positions in the deposition zone and distribute selenium vapour rather evenly throughout the deposition zone.

In a preferred embodiment of the invention the substrates are glass plates of about 120 cm wide and about 60 cm long, the sensors are thermocouples and the substrate heaters comprise many segments, typically 10 cm wide in the direction of substrate movements. The exact width depends on the overall geometry and size of the process chamber. The substrate heaters may for example be IR lamps. Described in a very short and incomplete way but with the intention to give the reader a general apprehension of the processes taking place in the process chamber the following facts are given: the process chamber is held at vacuum, the glass plates are at about 500° C. when entering the process chamber, the source heaters are heating the crucibles containing the respective elements to temperatures of about 1000 to 1500° C.

The Mo coated substrates 21 travel with uniform speed through the deposition zone DZ in the direction of arrow 22 on non-shown transfer mechanisms.

The transfer mechanisms are designed so that there is a continuous flow of substrates through the deposition zone, the leading edge of one substrate with a minimal separation to the trailing edge of a previous substrate. In the deposition zone, the evaporation sources are preferably located so that the substrates will see the Cu source before they see the In-source. Ga, which is evaporated in less amount than In (typically high performance CIGS films have Ga/(Ga+In) ratios of 0.15 to 0.40) is preferably located to give higher deposition rates near the entrance of the substrates to the deposition zone than the exit as is illustrated in FIG. 3.

Figure 3:
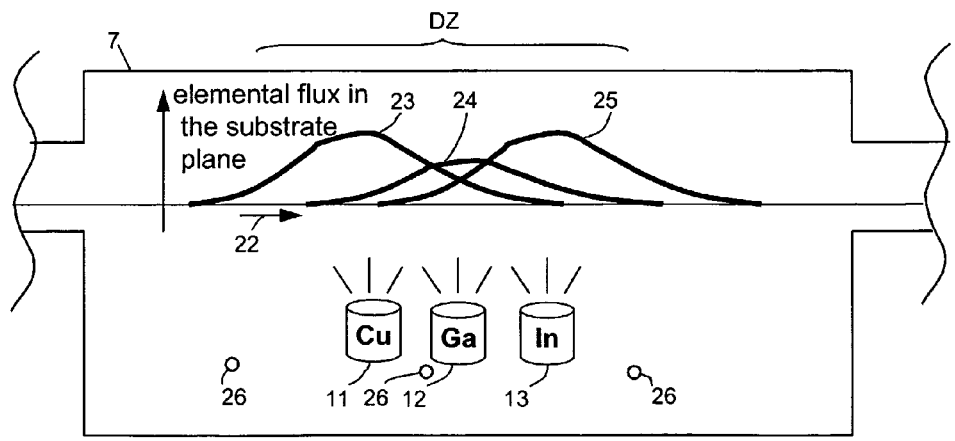

In FIG. 3 the elemental fluxes at different positions in the substrate plane in the direction of substrate movement are shown. In particular the copper evaporation flux is shown at curve 23, the gallium evaporation flux is shown at curve 24 and the indium evaporation flux is shown at curve 25. This way a Ga-gradient through the depth of the CIGS layer is introduced which improves solar cell performance.

As the substrate move through the deposition zone a copper rich layer of low resistivity will be deposited at the entrance end. This layer comprises copper selenide $Cu_xSe$ and $Cu(In,Ga)Se_2$. Further down the line, where the copper flux drops and the indium flux increases, the copper rich layer meets and almost instantly reacts with copper deficient $Cu(In,Ga)Se_2$ by giving away its copper to the copper deficient $Cu(In,Ga)Se_2$ as the substrate moves further down the line. The copper in the copper rich layer will thus be consumed. When the excessive copper in the $Cu_xSe$ has been consumed, which happens at a transition point generally shown at 27, the resulting CIGS layer generally comprise a high resistivity, copper deficient $Cu(In,Ga)Se_2$ layer.

The transition is very sharp and takes place over a short, as seen in the transport direction, clearly defined location or transition zone in the process chamber. In the following this point will be referred to as the reference transition point. For an operator of the in line production line there is not a single instant at which a transition takes place, but transitions take place all the time as the substrate move. The reference transition point will however not move in the deposition zone, provided the transport speed is uniform and the fluxes are stable therein. In accordance with the invention the reference transition point is used in order to control the formation of the CIGS composition.

Overall, the source arrangement is such that the growth is Cu-excessive in the entrance end of the deposition zone and Cu deficient in the exit end. The fluxes are adjusted to give a final composition of the CIGS film with a Cu/(In+Ga) ratio in the region 0.75-0.95, and a Ga/(In+Ga) ratio of about 0.10 to 0.45. In FIG. 7 the final composition of the CIGS film with a Cu/(In+Ga) ratio in the region 0.75-0.95 is illustrated. FIG. 7 also illustrates the sharp transition which takes place in the region 0.95 to 1.05.

The amounts of the respective deposited elements are shown in FIG. 4. The composition of the CIGS film at one specific location of the substrate is shown. How the composition at this location changes as the substrate travels through the process chamber is illustrated. Upstream the reference transition point the proportion of Cu to In+Ga is larger than 1 and downstream the transition point it is less than 1.

At each side of the reference transition point, at a distance of 5-30 cm, a respective sensor 18 and 19 is located which monitors a physical property related to the transition, in particular a parameter related to the emissivity, resistivity or heat capacitivity of the CIGS material composition.

If the reference transition point tends to move from its reference location, the shift is detected by the sensors. In principle, the reference transition point may move due either to a change in Cu or a change in (In+Ga) flux. The output signal from the sensors are fed as input signals to the controller in which there is a software program 28 that processes the input signals and provides a corrective output signal by which the evaporant fluxes are adjusted to compensate for the shift and bring the transition point back to the reference location.

The sensors are adapted to measure a physical parameter representative of the transition of the Cu rich layer into a Cu deficient layer. Exemplary parameters are emissivity, resistivity, heat capacitivity, intensity of light reflected by or transmitted through the deposited CIGS film, and intensity of specular light in relation to intensity of reflected light.

In the following a sensor measuring emissivity will be described in relation to FIG. 5 which in its turn is related to FIGS. 3 and 4. A substrate that moves with constant speed through the process chamber will cause an output signal from an emission sensor to follow an emissivity curve 29. Since speed is constant there is a linear relation between position and time ($s = v \cdot t$). The Mo coated substrate entering the process chamber has a low emissivity value because the metal will reflect a large fraction of the heat radiation from the substrate heaters. As the copper rich layer begins to deposit the emissivity increases and will reach a values that is representative of the copper rich layer. The emissivity will remain on this value until the transition occurs at which instant/position the emissivity changes sharply as is indicated with the broad dotted line 29. At this position a clear change of the emissivity, resistivity and heat capacitivity occurs.

With sensor 18 a high emissivity value is measured and with sensor 19 a low emissivity value is measured. Both sensors are measuring the emissivity. Suppose the in-line process has been running for a while and that a condition has been attained where the transition point lies still, i.e. it doesn't move. Now, if any of the Cu, Ga or In fluxes starts to vary so that the CIGS film becomes more copper rich this will imply that it will take longer time for the composition to become copper deficient. The transition point will thus shift from the reference position in a direction downwards the process chamber, i.e. to the right in FIG. 5. The output signal from sensor 19 will increase. The emissivity measured by the two sensors will now be high. The controller program will as a result of the processing of the two input signals deliver an output signal to that reduces the copper flux. The copper flow is reduced until the actual transition point has moved back to the reference transition point. If the output signal from sensor 18 decreases the transition point shifts in a direction upstream the reference transition point, i.e. to the left in the drawing, and copper flux must be increased until the actual transition point moves back to the reference position.

The fluxes from the respective evaporation sources are controlled by adjusting the power supplied to the respective sources. When the power is adjusted, the temperature will be correspondingly adjusted and the thermocouple 14', 15' or 16' will send its temperature reading to the controller.

The controller may for example order that the Cu source shall maintain 1500° C. The non-shown temperature controller at the Cu source will then adjust the heater 14 until the thermocouple 14' reports a temperature of 1500° C. If the reference transition point now shifts to the left in FIG. 2, the program in the controller will execute and order an increase of the Cu source temperature to 1502° C. The temperature controller increases the power to the heater, the temperature rises and this is detected with thermocouple 14' which reports the temperature back to the controller.

In the just described scenario it was assumed the shift of the transition point depended on a copper flux that varies. As already mentioned above the transition point may however in principle move due either to a change in Cu or a change in (In+Ga) flux. In order to make sure the right corrective action is taken by the controller additional information is needed. This can simply be the fact that Ga and In sources in general are more stable than a Cu source, and therefore the right corrective action is always assumed to be adjustment of the Cu-flux. In particular the power delivered to the Cu source heater 14 is adjusted. An additional possibility is to use the XRF device 20 provided further down the line or even outside the process chamber. Conventionally an XRF device measures total composition, and for thin CIGS layers the total amount of atoms of each deposited element can be determined. Thus a measure of CIGS layer thickness as well as of the elemental composition of the CIGS layer is obtained with an XRF device 20. Instead of an XRF device one may use any other device that measures the composition and/or the thickness of the CIGS layer.

If the transition point remains still this reflects that the composition of the CIGS layer is correct and that a transition has taken place, but it does not reflect the thickness of the CIGS layer. The thickness could in principle be anyone. Therefore thickness measurements need to be taken and the XRF device is used for this.

From the above it should be clear that the XRF device is primarily used for thickness measurements, even if also compositional data is obtained from it, and that the controller is adapted to control the vapour sources in order to obtain a CIGS layer of correct composition and correct thickness.

If the transition point moves to the right it would in principle be possible to decrease the In+Ga fluxes in order to obtain a more copper rich deposition, but the XRF device would then detect that the CIGS film starts to become thinner and would transmit a corresponding signal to the controller. The control program would then find out that the proper corrective action is to increase the copper flux. This gives a slow feedback but adds information on total deposited amounts of each element and not just the relative composition of the constituents. The process window for total deposited amounts, i.e. thickness, is substantially larger than for the composition. Also the process window for Ga/(Ga+In) ratio is relatively large. This means that the slow feedback can be used to adjust for drift in the In and Ga fluxes and the fast feedback for composition control by altering the Cu flux.

The following section explains why it is possible to detect the transition point by measuring the temperature at the thermocouples. Since the process takes place in vacuum heat is transferred to and from the complete aggregate of substrate and its deposited layers by way of radiation only. Heat transfer by way of conduction takes place within the aggregate. Following a start up phase of the in line system a condition of radiation equilibrium will appear i.a. between the substrates and the substrate heaters. In this state the substrate heaters radiate heat, the top surface of the aggregate, that is the surface facing the substrate heaters, will reflect some heat, and the bottom surface of the aggregate, that is the surface comprising the Mo and CIGS layers, will radiate some heat. As seen from the substrate heaters nothing changes as the depositions on the bottom surface progress; the substrate heaters continue to see only the substrate and the Mo layer. The substrate will continue to absorb and reflect the same amounts of heat, provided the power supplied to the substrate heaters is kept constant.

At the bottom surface the emissivity will change when transition takes place. When emissivity is low, the bottom surface will radiate little heat and the aggregate becomes warmer (due to heat conduction within the aggregate) provided the power supplied to the substrate heaters is kept constant. When emissivity is high, the bottom surface will radiate more heat and the aggregate becomes cooler.

Sensor 18, sitting at a location where emissivity is high will measure a certain temperature and sensor 19, sitting after the transition point and thus at a location where emissivity is lower, will measure a temperature which is higher when the transition point is between the sensors 18, 19.

Instead of holding the power to the source heaters constant it is possible to control them individually and regulate them so that the temperature of the substrates is held constant. The heaters at each side of the transition point would then need to be supplied with different powers in order to keep the substrate temperature constant. The power difference will thus indicate that the transition point is present between the substrate heaters in question.

As an alternative to use temperature sensors, which are specific embodiments of an emission sensor, in order to detect the transition point it is possible to use optical sensors of the kind described in the above referenced U.S. Pat. No. 5,633,033.

Still another alternative is to use a sensor that measures the intensity of light reflected by or transmitted through the deposited CIGS film.

A further alternative is to use an optical device that measures intensity of specular light and intensity of reflected light, the light impinging the top of the deposited CIGS film with an acute angle, one sensor measuring reflected light and another measuring specular light.

If a sensor takes absolute readings it is, in principle, possible to detect the transition point using one sensor only. The use of two or more sensors and comparing their readings in order to detect the transition point allows the use of relative readings. The controller and its software would then need to be correspondingly designed. In FIG. 2 third and fourth sensors 30, 31 are shown with dashed lines. The use of such third and fourth sensors allow for determination of the direction into which a transition points moves and/or for determination of the magnitude of the shift of the transition point. This information is used by the controller to take appropriate corrective actions to bring the transition point back to its reference position. The system of sensors 18, 19, 30, 31 will of course also allow determination of the current position of the transition point.

Figure 8:
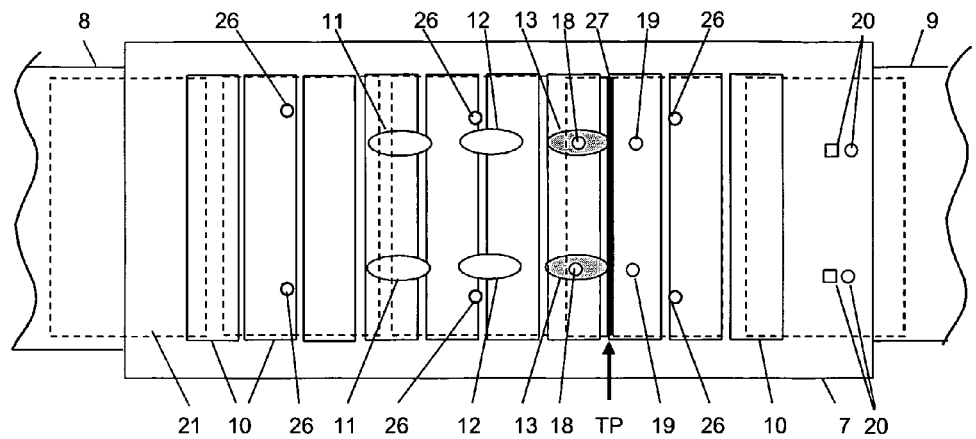

FIG. 8 is a top view of the CIGS process chamber and illustrates a second embodiment of the deposition system. Instead of having a single control system comprising a pair of sensors 18,19, evaporation sources 11, 12, 13, source heaters 14, 15, 16, source temperature sensors 14', 15', 16', an XRF source 20, and a controller 17 as shown in FIG. 2 a double control system may be used as shown in FIG. 8. Each control system comprises a pair of sensors 18,19, evaporation sources 11, 12, 13, source heaters 14, 15, 16, source temperature sensors 14', 15', 16', an XRF source 20 and a controller 17. The two control systems are arranged side by side. The transition point is thus controlled at two points as seen in a direction over the width of the substrate material. If one looks at FIG. 8 one could say that there are two rows of controls, although this expression is general and non-exact. Each control system is essentially, but not completely, independent of the other. Accordingly control of one transit point is essentially independent of control of the other. As described above a transit point is controlled by controlling the power to the source heaters. By this arrangement an accurate control of the deposition of the CIGS film over the width of the substrates is achieved.

The use of two rows of evaporation sources allows adjustment of the elemental composition and the thickness of the CIGS layer over the width of the substrate. In accordance with the invention, the ability to control each row of sources will provide a possibility to adjust for non-uniformity of thickness and non-uniformity of composition (of the CIGS layer) over the with of the substrate. This is an advantage over the use of known linear evaporation sources which cannot provide such adjustments, since it is not possible to control the amount of evaporation flux at one side in relation to the amount of evaporation flux at the other side.

It is possible to control the evaporation sources of one row independently of the evaporation sources of the other row. It is, however, possible to use a dependency between the rows in order to increase the accurateness of the control. For example, say that a measurement is taken on the sources in one row, called the first row. If we know that 90% of the resulting measurement emanates from the sources in said first row and that 10% emanates from sources in another other row, called the second row then this knowledge can be used to provide a smarter corrective action. This is because an corrective action can be weighted among the two rows. Therefore control of the evaporation sources in a row may be dependent on the control of the evaporation sources of another row.

A modification of the FIG. 8 embodiment is to use three or more control systems arranged side by side over the width of the substrates and control the transit point at three or more positions.

Figure 9:
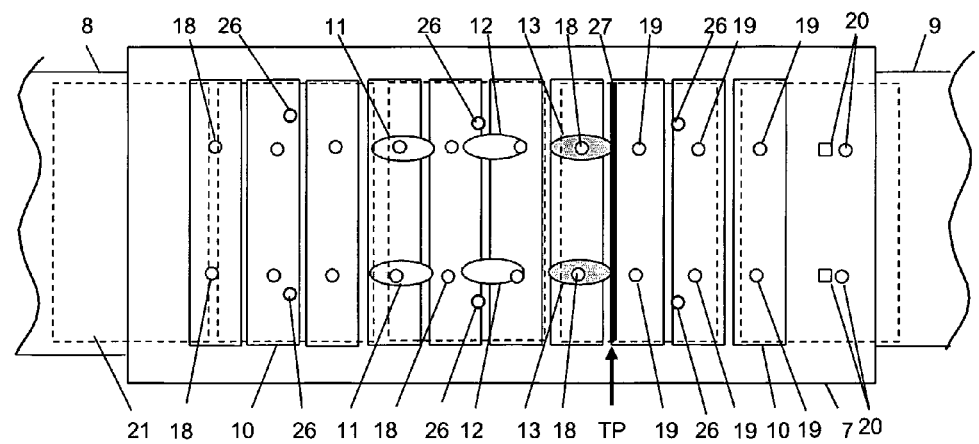

In FIG. 9 a modification of the invention is shown wherein there is a sensor 18 or 19 at each substrate heater, thus allowing for determination of the transition point at any location within the deposition zone. As shown there are also double rows of control systems like in the FIG. 8 arrangement which will allow for precise control of the deposition of the CIGS film over the width of the substrates wherever transition points are detected. Depending on the implementation of the substrate heaters there may be two or more sensors at each substrate heater in each control system.

A modification of the FIG. 9 embodiment is to use three or more control systems arranged side by side over the width of the substrates and control the transit point at three or more positions.

The above embodiments are based on detection of the sharp transition from a Cu-rich film composition to a Cu-deficient film composition. Given the various constant conditions the sharp transition is measured at a relatively fixed position within the process chamber. Next there will be disclosed some embodiments which are not based on detection of the sharp transition, but instead on detection of the composition of CIGS film. There is thus no need to detect a transition point, but detection can take place at many places other than that in the vicinity of the transition point. As will be seen further down detection can take place at the outlet portion of the process chamber and detection can even take place outside the process chamber. The following embodiments will thus provide more freedom as regards detection sites.

Figure 10:
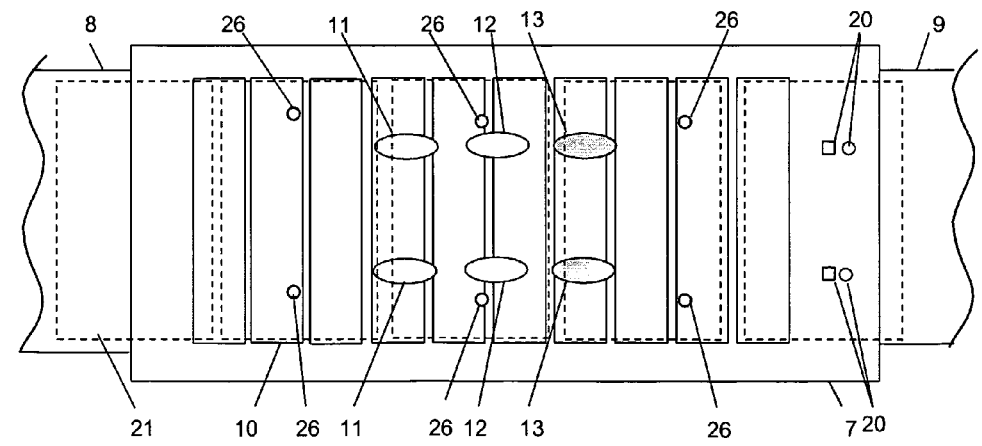

FIG. 10 discloses a control system wherein sensors 18, 19, 30, 31 are omitted and instead a plurality of XRF devices 20 are arranged downstream the deposition zone near the outlet. Like in the FIG. 8 arrangement there may be several rows of XRF devices over the width of the substrate. The XRF devices in each row are connected to a respective controller 17 which is adapted to control the composition as well as thickness of the deposited CIGS layer to and adjust any of the individual evaporation sources 11-13 so as to obtain a CIGS layer with the desired composition and with the desired thickness over the width of as well as length of the substrates.

In the FIG. 10 embodiment of the invention the amounts of the respective substances of the CIGS layer as well as the thickness of the CIGS layer are detected.

An XRF device is capable of taking absolute measurements of the amounts of each of the elements in the CIGS layer. As a consequence also the total amount of each of the elements and therefore also the thickness of the CIGS layer may be measured. In principle it is not required to measure the selenium content, since this is self adjusting. Instead of an XRF device it possible to use an EDX (Energy Dispersive X-ray spectroscope) device similar to the kind used in electron microscopes.

If simultaneous contents and thickness measurements cannot be taken by one and the same device it is possible to use a separate device for taking direct or indirect measurements relating to the composition of the CIGS layer, and a separate device for measuring the thickness of the CIGS layer, said separate devices can be positioned outside the deposition system. Examples of thickness measuring devices are points or needles tracking the upper surface of the CIGS layer, so called profilometers. Other examples are optical devices.

An example of taking indirect measurements of the CIGS layer composition is to calibrate the element composition against a physical parameter such as resistance in order to get a measure of the amount of the respective elements Cu, Ga, In and, not necessary, Se.

Figure 11:
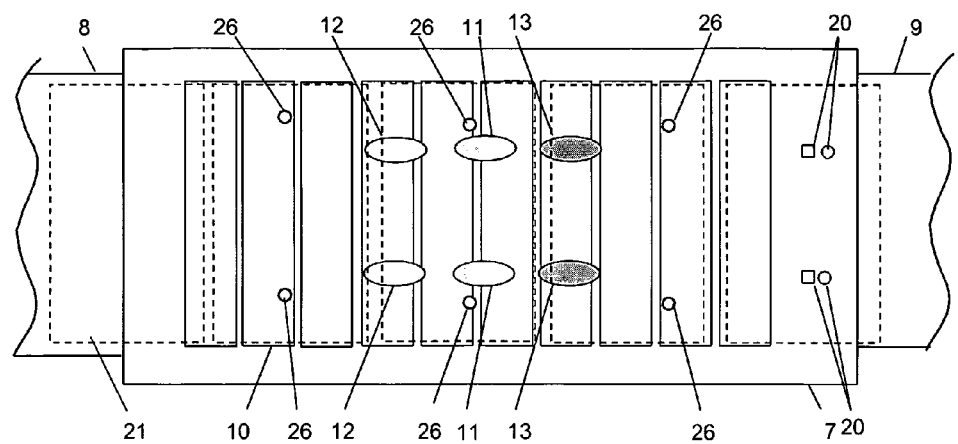
Figure 12:
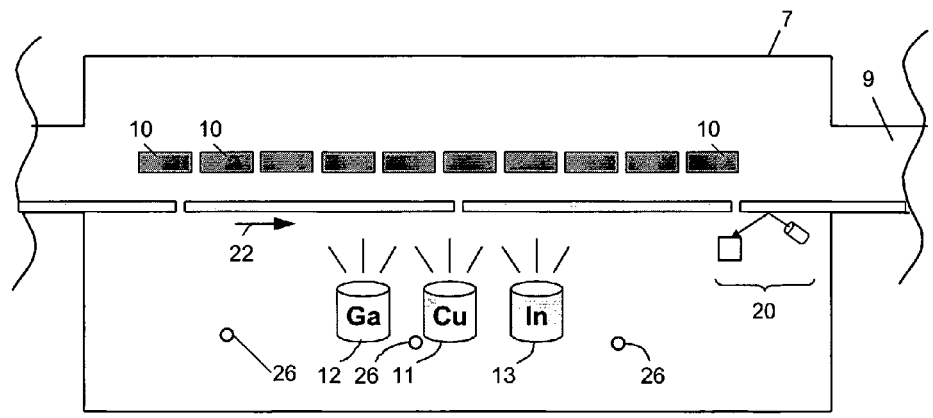
Figure 13:
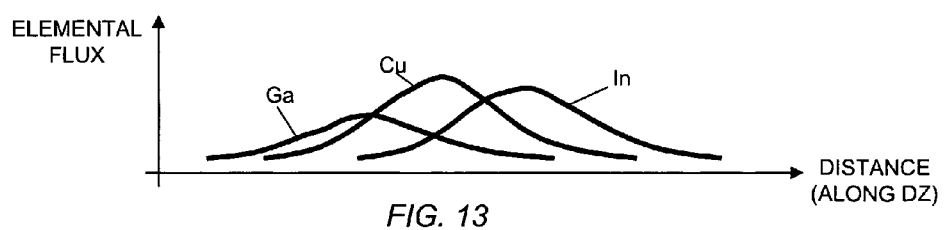

The order in which a Mo-coated substrate material meets the various elemental sources 11-13 may be changed and need not be the one shown in FIGS. 1-10. In FIGS. 11 and 12 an embodiment is disclosed wherein there are two rows of element sources 11-13 and XRF devices 20. A substrate first meets two Ga-sources 12, then two Cu-sources 11 and finally two In-sources 13. Selen sources 26 will provide the deposition zone with a vapour of selenium in excess. Each XRF device is connected to a respective controller 17. In FIG. 13 the relative emissions from the elemental sources 11-13 in FIGS. 11 and 12 are shown. The abscissa is the is the distance an Mo coated substrate 21 travels in deposition zone DZ.

In FIGS. 10, 11 and 12 the relation $Cu/(In+Ga)>1$ applied in the embodiments of FIGS. 1-9 need not be fulfilled since no distinct detection of a transition point is made. Instead a more gradual detection of composition is made with the XRF devices and the relation $Cu/(In+Ga)$ need not be larger than 1 at any time during deposition.

Figure 14:
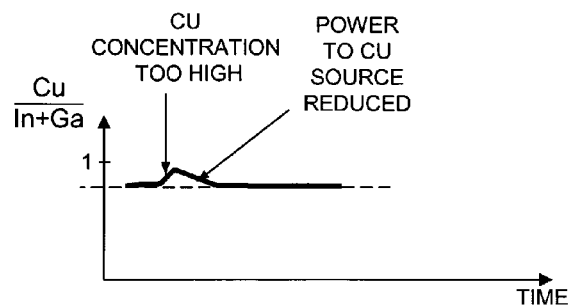

The output signal from an XRF device used in FIGS. 11 and 12 is processed and a resulting control signal is schematically shown in FIG. 14. The control signal measures concentration and is constant when a correct proportion of elements has been attained in the deposited CIGS layer. If for example the Cu-concentration is too high the controller will take a corrective action and reduce the power supplied to the heater 14 of the Cu evaporation source 11. After correction the control signal returns to the constant value. Before one can say that the Cu concentration is too high one has to decide if the reason for the elevated Cu concentration is a consequence of a reduced concentration of gallium and indium. A reduced concentration of gallium and indium manifests itself in a reduced thickness of the deposited CIGS layer. If the thickness is too small one has to increase the power to the heaters of the Ga- and In-sources first and thereafter take a new Cu reading before one increases the power to the heater of the Cu source.

Figure 15:
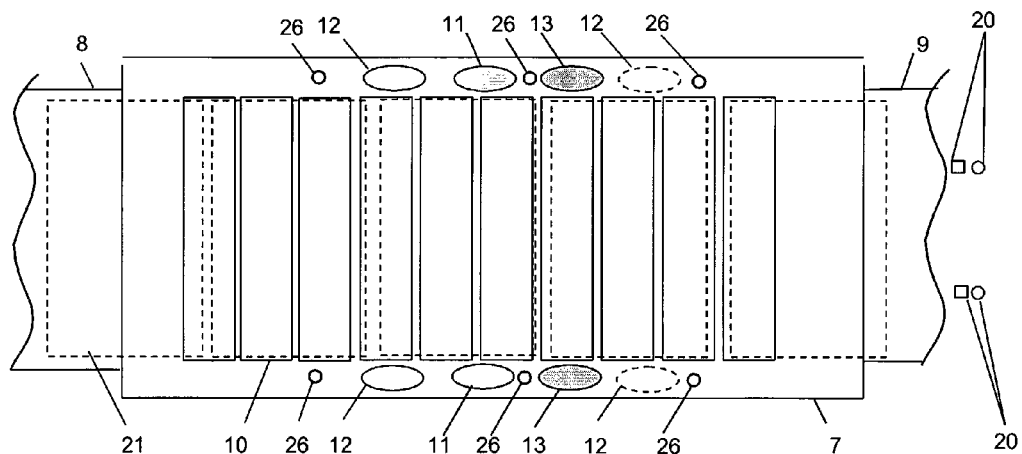
Figure 16:
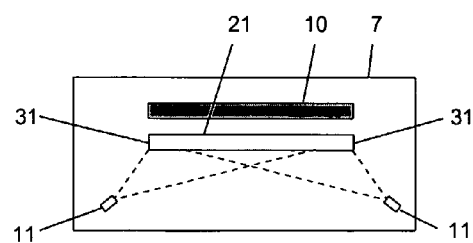

In FIGS. 15 and 16 still another embodiment of the invention is shown wherein there are two rows of evaporation sources 11, 12, 13 and 26 arranged, not under the Mo-coated substrates as in the previously described embodiments, but displaced laterally so that each row is arranged at the side of and with a distance to the edges of the substrates 21. If flaws of deposited material get loose and fall down, or if a Mo-coated glass substrate cracks, nothing will fall down on the evaporation sources and thereby disturb the deposition.

A further feature of the embodiment in FIG. 15 is that the XRF devices 20 are arranged outside the deposition system, thereby taking the composition and thickness measurements on substrates that are outside the process chamber. As a modification of this feature it is possible to use a single XRF device that is moved from one row position, where it takes measurements relating to the evaporations sources along that one row, to the other row position where it takes measurements relating to the evaporations sources along the other row of evaporation sources. If there are three rows of evaporation sources the XRF device would move between the three row positions taking measurements at each one.

A further modification of the FIG. 15 embodiment is to use a further set of Ga evaporation sources 12 arranged downstream the In evaporation sources 13, as shown with the dashed lines. Still a further modification is to use the following sequence of evaporation sources as seen in the travelling direction 22: In—Cu—Ga. It is thus possible to use several Ga sources and the positions of the Ga sources in relation to the Cu source may shift. Another modification is to use the following sequence: In—Cu—Ga—In.

FIG. 16 illustrates the arrangement and orientation of two evaporation sources 11 in relation to a substrate 21 travelling through the process chamber 7. Each source sits beneath the level of a transported substrate and at the side thereof at a distance from the nearby edge 31 of the substrate. As appears at the dashed lines the emissions from the two evaporation sources overlap in the middle region of a substrate, thereby both contributing to the deposition of this area. Areas outside this middle region are subject to deposition from primarily one source. With the illustrated arrangement and orientation of evaporation sources it is possible to obtain a uniform thickness of the layer that is deposited by the illustrated sources.

The invention claimed is:

1. An in-line continuous substrate flow production apparatus for fabrication of copper indium gallium diselenide (CIGS) solar cells, comprising:
    a CIGS process chamber comprising a deposition zone (DZ) therein, the deposition zone configured for substrates provided with a molybdenum back contact layer to be continuously moved therethrough,
    the process chamber further comprising:
    a plurality of separated substrate heaters,
    evaporation sources with Cu, In, Ga and Se, the evaporation sources configured to produce evaporant fluxes for depositing respective amounts of Cu, In, Ga and Se to a substrate, the evaporation sources provided in respective rows over a width of the substrate,
    source heaters provided with said evaporation sources,
    at least one composition detection device for detecting, in a deposited CIGS film at each of the rows, respective amounts of elements deposited by said evaporation sources, and
    a controller connected to said at least one composition detection device, the controller adapted to adjust the evaporant fluxes in each of the respective rows in response to a detected variation, in the CIGS film, of the respective amounts deposited of each element in order to provide a CIGS layer having a uniform composition of elements.

2. The in-line continuous substrate flow production apparatus in accordance with claim 1, wherein said controller being adapted to adjust the evaporant fluxes in the respective rows in order to provide a CIGS film of uniform thickness.

3. The in-line continuous substrate flow production apparatus in accordance with claim 1, wherein two rows of vapour sources are arranged over a width of the process chamber as seen in a transport direction of the substrates, the two rows of evaporation sources being arranged at each side of and outside a path along which the substrates flow through the deposition chamber.

4. The in-line continuous substrate flow production apparatus in accordance with claim 1, wherein said at least one composition detection device is provided within the process chamber.

5. The in-line continuous substrate flow production apparatus in accordance with claim 1, wherein said at least one composition detection device is provided outside the process chamber.

6. The in-line continuous substrate flow production apparatus in accordance with claim 1, wherein the evaporant vapor sources are arranged at a level below the substrates.

7. The in-line continuous substrate flow production apparatus in accordance with claim 1, wherein said at least one composition detection device is one of an X-ray fluorescence device or an EDX (energy dispersion X-ray spectroscopy) device adapted to measure total deposited amounts of each element and to measure the thickness of the CIGS layer.

8. The in-line continuous substrate flow production apparatus in accordance with claim 1, wherein the controller is adapted to receive an input signal representative of total deposited amounts of each element and, in response to said input signal, adjust the evaporant fluxes from the evaporant sources in order to provide a uniform thickness of the CIGS film.

9. The in-line continuous substrate flow production apparatus in accordance with claim 1, wherein said at least one composition detection device is a device that measures the composition of the CIGS layer indirectly by calibrating against a physical parameter to obtain a measure of an amount of Cu, Ga, and In.

10. The in-line continuous substrate flow production apparatus in accordance with claim 1, wherein said at least one composition detection device is a resistance measuring device.

11. The in-line continuous substrate flow production apparatus in accordance with claim 1, further comprising:
    a separate thickness measuring device connected to the controller for measuring the thickness of the deposited CIGS film, the controller being adapted to, in response to a detected thickness variation, adjust the evaporant fluxes from the evaporant sources in order to provide a uniform thickness of the CIGS film.

12. The in-line continuous substrate flow production apparatus in accordance with claim 11, wherein the thickness measuring device is a profilometer.

13. The in-line continuous substrate flow production apparatus in accordance with claim 1, wherein the evaporant sources with Cu, Ga and In are arranged in an order of: Ga, followed by Cu, followed by In, with respect to a transport direction of the substrates.

14. The in-line continuous substrate flow production apparatus in accordance with claim 13, wherein a further evaporation source with Ga is arranged downstream the In evaporation source with respect to the transport direction of the substrates.

15. The in-line continuous substrate flow production apparatus in accordance with claim 1, wherein there are evaporant sources with Cu, Ga and In and the evaporation sources are arranged in the following order as seen in the transport direction of a substrate: In, Cu, Ga.

16. The in-line continuous substrate flow production apparatus in accordance with claim 15, wherein a further evaporation source with In arranged downstream the Ga evaporation source.

* * * * *